United States Patent
Liu et al.

(10) Patent No.: US 10,615,196 B2
(45) Date of Patent: Apr. 7, 2020

(54) METHOD FOR FABRICATING A CONTACT HOLE OF AN ARRAY SUBSTRATE, ARRAY SUBSTRATE AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Jun Liu, Beijing (CN); Yongchao Huang, Beijing (CN); Tongshang Su, Beijing (CN); Leilei Cheng, Beijing (CN); Jun Wang, Beijing (CN); Ning Liu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 16/037,159

(22) Filed: Jul. 17, 2018

(65) Prior Publication Data

US 2019/0074306 A1 Mar. 7, 2019

(30) Foreign Application Priority Data

Sep. 4, 2017 (CN) .......................... 2017 1 0787331

(51) Int. Cl.
*H01L 27/12* (2006.01)
*H01L 29/786* (2006.01)
(Continued)

(52) U.S. Cl.
CPC ...... *H01L 27/1288* (2013.01); *H01L 21/3081* (2013.01); *H01L 21/31116* (2013.01);
(Continued)

(58) Field of Classification Search
CPC ......... H01L 21/76802; H01L 21/31116; H01L 21/31144; H01L 21/32139;
(Continued)

(56) References Cited

U.S. PATENT DOCUMENTS

| | | | |
|---|---|---|---|
| 6,437,370 B1 * | 8/2002 | Matsuno | H01L 27/12 257/458 |
| 7,088,401 B1 * | 8/2006 | Ihara | G02F 1/136213 257/72 |

(Continued)

FOREIGN PATENT DOCUMENTS

CN 104332477 2/2015

OTHER PUBLICATIONS

First Office Action of Chinese Application No. CN201710787331.8.

*Primary Examiner* — Kyoung Lee
*Assistant Examiner* — Christina A Sylvia
(74) *Attorney, Agent, or Firm* — Arent Fox LLP; Michael Fainberg

(57) ABSTRACT

A method for fabricating a contact hole of an array substrate, an array substrate and a display device are disclosed, the method includes: coating a topmost layer with a first photoresist coating, exposing but not developing a part of the first photoresist coating, corresponding to a first contact hole, in an exposure process; coating the first photoresist coating with a second photoresist coating, exposing a part of the second photoresist coating, corresponding to the first contact hole, in an exposure process; developing and removing exposed parts of the first and second photoresist coatings, wherein a size of a removed part of the second photoresist coating, corresponding to the first contact hole, is smaller than a size of a removed part of the first photoresist coating, corresponding to the first contact hole; and (Continued)

removing parts of functional film layers, corresponding to the first contact hole, to form the first contact hole.

16 Claims, 5 Drawing Sheets

(51) Int. Cl.
  *H01L 21/308* (2006.01)
  *H01L 21/311* (2006.01)
  *H01L 21/3213* (2006.01)
  *H01L 21/768* (2006.01)

(52) U.S. Cl.
  CPC .. *H01L 21/31144* (2013.01); *H01L 21/32134* (2013.01); *H01L 21/32139* (2013.01); *H01L 21/76802* (2013.01); *H01L 27/124* (2013.01); *H01L 27/1244* (2013.01); *H01L 29/78633* (2013.01)

(58) Field of Classification Search
  CPC ........... H01L 21/32134; H01L 21/3081; H01L 27/1288; H01L 27/124
  See application file for complete search history.

(56) References Cited

U.S. PATENT DOCUMENTS

| | | | |
|---|---|---|---|
| 8,258,512 B2* | 9/2012 | Nishi | H01L 27/14634 257/59 |
| 2005/0277064 A1* | 12/2005 | Lamarre | G03F 7/0035 430/312 |
| 2006/0111244 A1* | 5/2006 | Gan | H01L 29/4908 505/193 |
| 2012/0156834 A1* | 6/2012 | Chou | H01L 27/1288 438/158 |
| 2015/0279863 A1* | 10/2015 | Xu | H01L 27/1222 438/158 |
| 2016/0043117 A1* | 2/2016 | Guo | H01L 27/1288 438/158 |
| 2016/0141425 A1 | 5/2016 | Sun et al. | |

* cited by examiner

METHOD FOR FABRICATING A CONTACT HOLE OF AN ARRAY SUBSTRATE, ARRAY SUBSTRATE AND DISPLAY DEVICE

CROSS-REFERENCE TO RELATED APPLICATION

This Application claims priority to Chinese Patent Application No. 201710787331.8, filed on Sep. 4, 2017, the content of which is incorporated by reference in the entirety.

TECHNICAL FIELD

This disclosure relates to the field of display technologies, and particularly to a method for fabricating a contact hole of an array substrate, an array substrate, and a display device.

DESCRIPTION OF THE RELATED ART

The existing OLED with a large size has gradually become a new hotspot in the field of TV sets due to its high contrast and self-luminescence, and particularly the OLED with a large size has been favored because a top gate therein has a higher Ion, a higher aperture ratio, and a higher TFT stability than those of a bottom gate. Particularly in a display screen of the OLED with a large size, in order to guarantee the stability of a channel layer, a metal pattern layer is fabricated below the top-gate TFT as a light-shielding metal layer to avoid light from the outside from interfering with a characteristic thereof, but a problem of dual TFTs occurring may interfere with the characteristic of the TFT, so that the TFT may become instable.

SUMMARY

Embodiments of the disclosure provide a method for fabricating a contact hole of an array substrate, an array substrate and a display device.

In an aspect, the embodiments of the disclosure provide a method for fabricating a contact hole of an array substrate, the method including: forming a first metal layer on a substrate, and forming a first metal pattern in a patterning process; forming a plurality of functional film layers sequentially above the first metal layer; coating a topmost one of the plurality of functional film layers with a first photoresist coating, and exposing but not developing a part of the first photoresist coating, which corresponds to a first contact hole for connecting a conductive metal structure with the first metal layer, in an exposure process; coating the first photoresist coating with a second photoresist coating, and exposing a part of the second photoresist coating, which corresponds to the first contact hole, in an exposure process; developing and removing exposed parts of the first photoresist coating and the second photoresist coating; wherein a size of a removed part of the second photoresist coating, which corresponds to the first contact hole, is smaller than a size of a removed part of the first photoresist coating, which corresponds to the first contact hole; and dry-etching the plurality of functional film layers, and removing parts of the plurality of functional film layers, which correspond to the first contact hole, to form the first contact hole.

In some embodiments, the plurality of functional film layers include a buffer layer and an interlayer insulation layer, formed above the first metal layer in that order, and the first contact hole extends through the interlayer insulation layer and the buffer layer.

In some embodiments, the first metal layer is a light-shielding metal layer, and the plurality of functional film layers further include a channel layer, a gate insulation layer and a gate metal layer, formed above the buffer layer in that order after the buffer layer is formed, and before the interlayer insulation layer is formed.

In some embodiments, the array substrate includes a source and a drain, the source or the drain is formed with the conductive metal structure, and a part of the second photoresist coating, which corresponds to a second contact hole for connecting the source and the drain in the array substrate with the channel layer, is further exposed in an exposure process while the part thereof corresponding to the first contact hole is being exposed; and dry-etching the plurality of functional film layers includes: dry-etching the interlayer insulation layer, and removing a part of the interlayer insulation layer, which corresponds to the first contact hole; ashing the second photoresist coating and the first photoresist coating to remove the second photoresist coating, and to form a via hole through a part of the first photoresist coating, which corresponds to the second contact hole, to expose the interlayer insulation layer; and dry-etching the interlayer insulation layer and the buffer layer to remove a part of the interlayer insulation layer, which corresponds to the second contact hole, to form the second contact hole, and removing a part of the buffer layer, which corresponds to the first contact hole, to form the first contact hole.

In some embodiments, the method further includes: forming a pattern of the gate insulation layer and a gate pattern, after the gate insulation layer is formed on a pattern of the channel layer and the gate metal layer is formed on the gate insulation layer; wherein forming the pattern of the gate insulation layer and the gate pattern includes: coating the gate metal layer with a photoresist; exposing the photoresist using a mask to form a gate mask; wet-etching the gate metal layer to form the gate pattern; reserving the photoresist, and dry-etching the gate insulation layer to form the pattern of the gate insulation layer; and etch-stripping the photoresist to remove the photoresist.

In some embodiments, a material of the interlayer insulation layer is the same as a material of the buffer layer.

In some embodiments, a thickness of the buffer layer ranges from 0.3 μm to 0.5 μm; and/or a thickness of the channel layer ranges from 0.05 μm to 0.09 μm; and/or a thickness of the gate insulation layer ranges from 0.1 μm to 0.2 μm; and/or a thickness of the gate metal layer ranges from 0.4 μm to 0.6 μm; and/or a thickness of the interlayer insulation layer ranges from 0.3 μm to 0.5 μm.

In some embodiments, the method further includes: post-baking the first photoresist coating after the first photoresist coating is exposed in an exposure process, and before the second photoresist coating is coated.

In some embodiments, an edge of a second via hole formed in the second photoresist coating in correspondence to the first contact hole protrudes more than an edge of the first via hole formed in the first photoresist coating in correspondence to the first contact hole by 2 μm to 4 μm along a direction toward a center axis of the second via hole.

In some embodiments, a thickness of the light-shielding metal layer ranges from 0.1 μm to 0.2 μm.

In some embodiments, the thickness of the light-shielding metal layer is 0.15 μm.

In some embodiments, a thickness of the first photoresist coating is less than or equal to a thickness of the second photoresist coating.

In another aspect, the embodiments of the disclosure further provide an array substrate including a contact hole, wherein the contact hole is fabricated using the method above for fabricating the contact hole of the array substrate according to the embodiments of the disclosure.

In some embodiments, the contact hole includes a first contact hole and a second contact hole; and the array substrate further includes a metal layer formed on an interlayer insulation layer of the plurality of functional film layers after the first contact hole and the second contact hole are formed.

In some embodiments, the metal layer includes a pattern of a source and a drain formed in a patterning process; and the array substrate further includes a passivation layer formed on the pattern of the source and the drain.

In some embodiments, a thickness of the metal layer ranges from 0.5 μm to 0.7 μm.

In still another aspect, the embodiments of the disclosure further provide a display device including the array substrate above according to the embodiments of the disclosure.

BRIEF DESCRIPTION OF THE DRAWINGS

In order to make the technical solutions according to embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

The technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

As illustrated in FIG. 1A to FIG. 1H and FIG. 3, a method for fabricating a contact hole of an array substrate according to the embodiments of the disclosure is applicable to a thin film transistor with a top gate, and includes the following operations.

The operation S101 is to form a first metal layer on a substrate 1, and to form a first metal pattern in a patterning process.

The operation S102 is to form a plurality of functional film layers sequentially above the first metal layer.

The operation S103 is to coat a topmost one of the plurality of functional film layers with a first photoresist coating 8, and to expose but not develop a part of the first photoresist coating 8, which corresponds to a first contact hole 11 for connecting a conductive metal structure with the first metal layer, in an exposure process.

The operation S104 is to coat the first photoresist coating 8 with a second photoresist coating 9, and to expose a part of the second photoresist coating 9, which corresponds to the first contact hole 11, in an exposure process.

The operation S105 is to develop and remove exposed parts of the first photoresist coating 8 and the second photoresist coating 9, where a size of a removed part of the second photoresist coating 9, which corresponds to the first contact hole 11, is smaller than a size of a removed part of the first photoresist coating 8, which corresponds to the first contact hole 11.

The operation S106 is to dry etch the plurality of functional film layers, and to remove parts of the plurality of functional film layers, which correspond to the first contact hole 11, to form the first contact hole 11.

The inventors of the disclosure have identified during their researches that the inorganic film layer is typically set with a significant thickness in the related art due to the interference caused by the problem of dual TFTs to the characteristic of the TFT, and the usage characteristic and good yield of the substrate, thus the inorganic film layer of the contact hole to be etched is fairly thick, that is, the depth for dry etching of the contact hole is pretty deep, therefore the photoresist coating to be coated for etching is comparatively thick, which may result in a sharp slope of the contact hole after dry etching, and a high risk of breaking the conductive metal structure deposited in the contact hole.

Figure 1A:
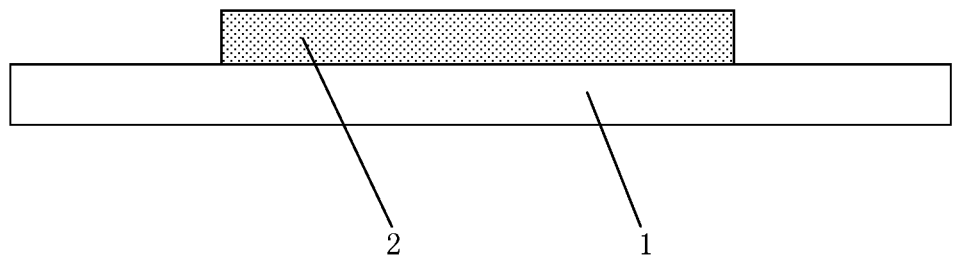
FIG. 1A to FIG. 1H are schematic diagrams of structural variations of respective film layers while a contact hole is being fabricated using a method for fabricating a contact hole of an array substrate according to the embodiments of the disclosure.
Figure 1B:
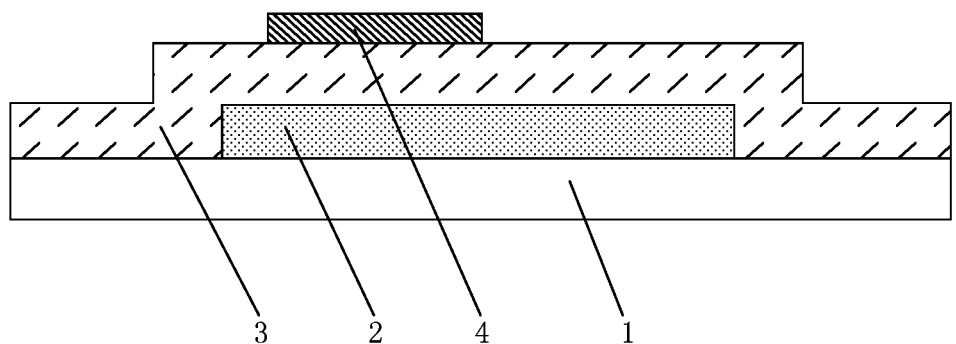
Figure 1C:
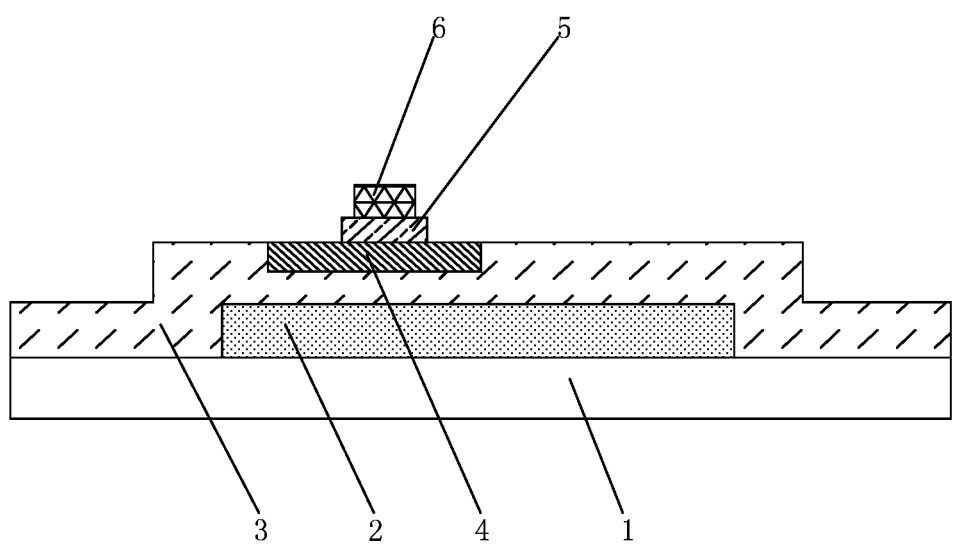
Figure 1D:
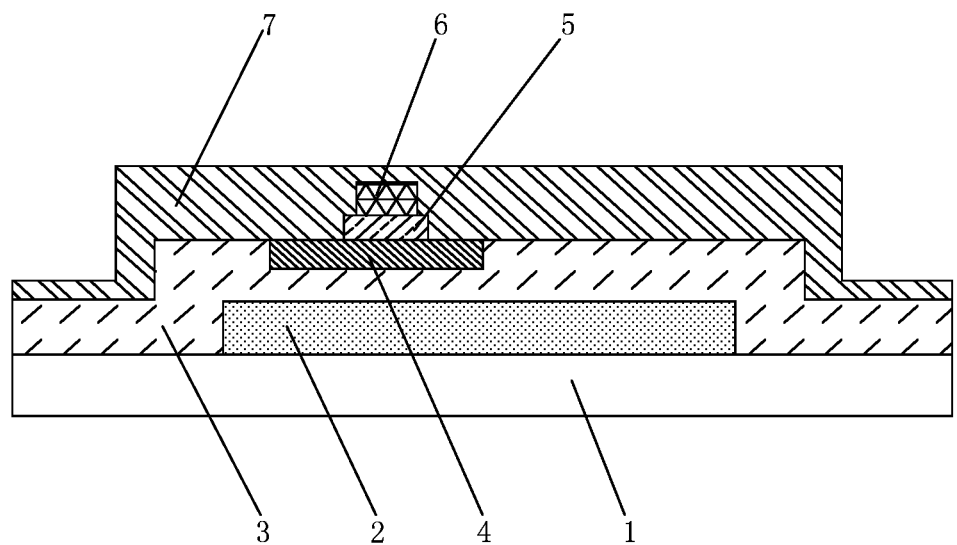
Figure 1E:
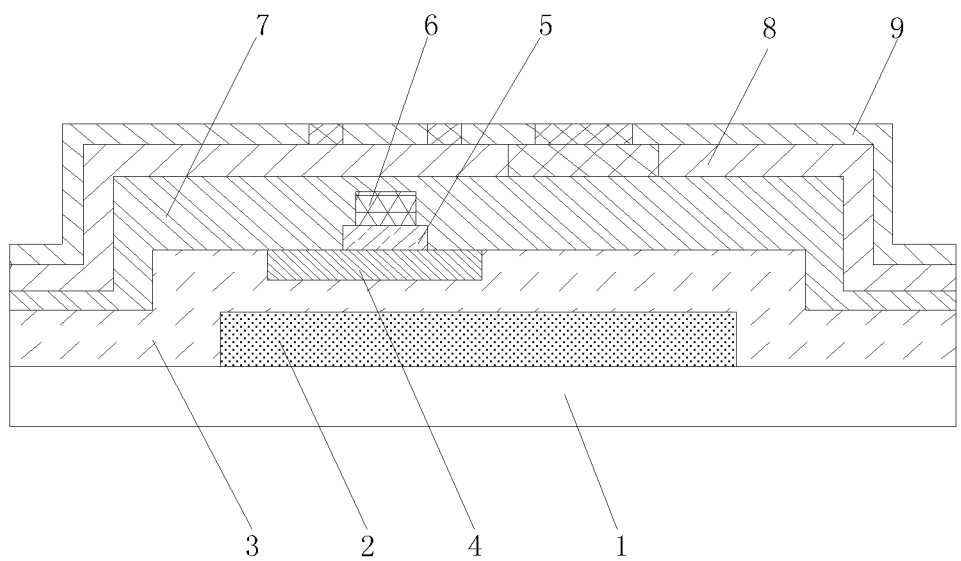
Figure 1F:
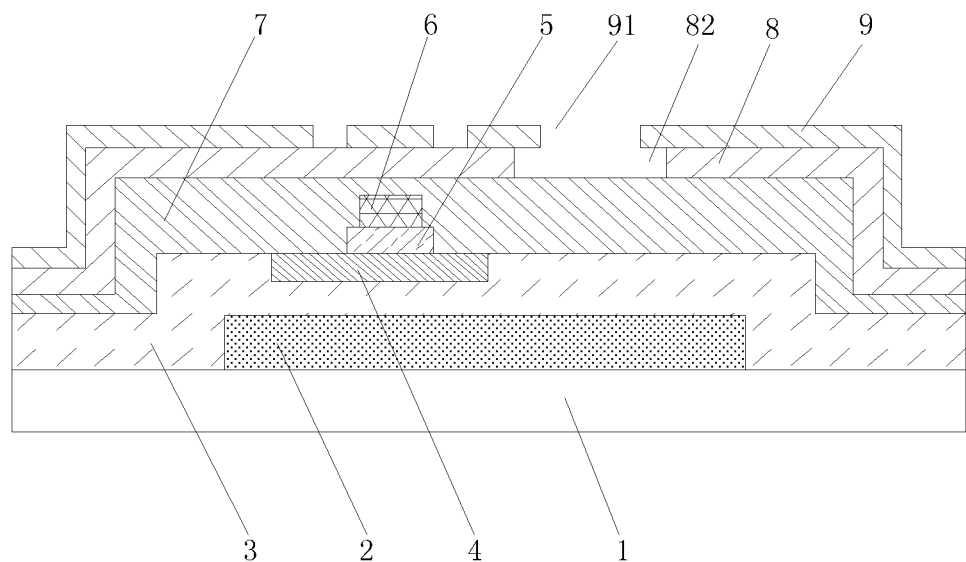
Figure 1G:
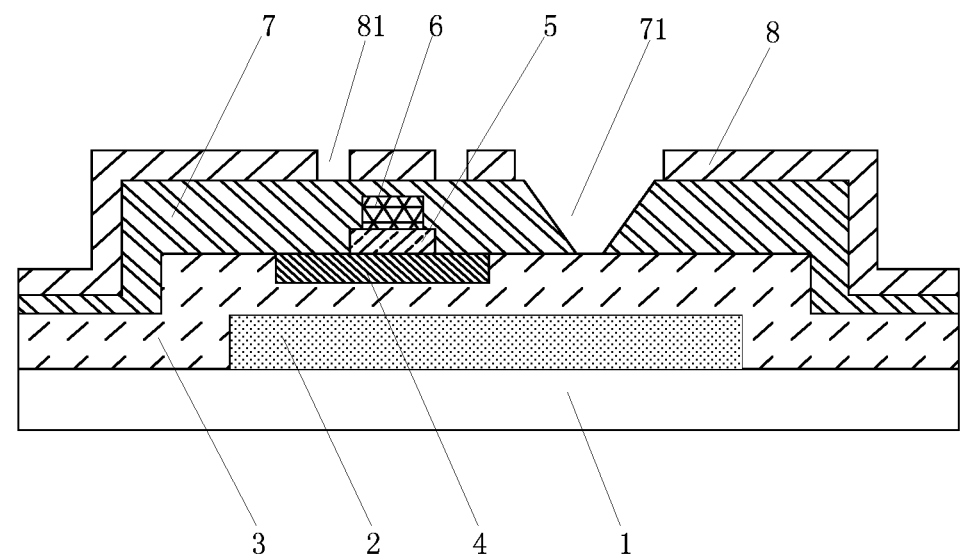
Figure 1H:
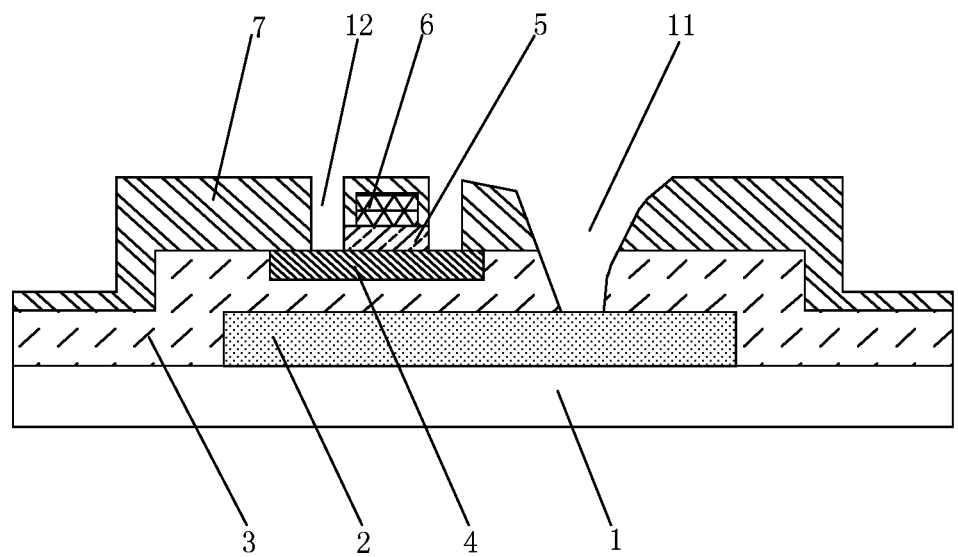

In order to alleviate this risk, as illustrated in FIG. 1 to FIG. 1H, in the method above for fabricating the contact hole of the array substrate according to the embodiments of the disclosure, after the first metal layer and the first metal layer pattern are formed on the substrate 1 in the operation S101, the plurality of functional film layers are formed above the first metal layer in the operation S102; then in the operation S103, the topmost one of the plurality of functional film layers is coated with a photoresist layer to form the first photoresist coating 8, and the part of the first photoresist coating 8, which corresponds to the first contact hole 11 for connecting the conductive metal structure with the first metal layer is exposed but not developed in the exposure process using a mask of the first photoresist coating, where since the part of the first photoresist coating which corresponds to the first contact hole is not developed, the exposed part of the first photoresist coating 8 is not removed for the time being, so that the thickness of the part of the second photoresist coating 9, which corresponds to the first contact hole 11 will not increase while a second photoresist layer is being subsequently coated, but the second photoresist coating 9 can be formed with a uniform thickness to thereby facilitate a subsequent process.

After that, in the operation S104, the first photoresist coating 8 is coated with the second photoresist coating 9, and the part of the second photoresist coating 9, which corresponds to the first contact hole 11 is exposed in the exposure process using a mask of the second photoresist coating. Next in the operation S105, the exposed parts of the first photoresist coating 8 and the second photoresist coating 9 are developed and removed, that is, the exposed second photoresist coating 9 is developed by controlling a development period of time, and also the part of the first photoresist coating 8, which corresponds to the first contact hole 11 is removed. Where a diameter of the removed part of the second photoresist coating 9, which corresponds to the first contact hole 11 is less than a diameter of the removed part of the first photoresist coating 8, which corresponds to the first contact hole 11, that is, the developed parts of the first photoresist coating 8 and the second photoresist coating 9, which correspond to the first contact hole 11, appear in a form of "凸" in a sectional view as illustrated in FIG. 1F. And then in the operation S106, the plurality of functional film layers are dry-etched, and the parts of the plurality of functional film layers, which correspond to the first contact hole 11 are removed, so that the first contact hole 11 is formed in a topmost film layer as illustrated in FIG. 1G and FIG. 1H, where the side of the formed first contact hole 11 has a certain slope, that is, the first contact hole 11 is formed in a shape of an upside-down frustum with an opening larger than a bottom thereof. Therefore, while the conductive metal structure is being subsequently formed in the first contact hole 11, the side of the conductive metal structure in the first contact hole formed in the shape of the upside-down frustum will have a certain slope, thus alleviating the risk of breaking.

Accordingly in the method above for fabricating the contact hole of the array substrate according to the embodiments of the disclosure, the side of the first contact hole 11 formed on the substrate 1 has a certain slope, so the side of the conductive metal structure in the first contact hole 11 has a certain slope, thus alleviating the risk of breaking the metal structure deposited in the first contact hole 11.

In some embodiments, the plurality of functional film layers include a buffer layer 3 and an interlayer insulation layer 7, formed above the first metal layer in that order, and the first contact hole 11 extends through the interlayer insulation layer 7 and the buffer layer 3.

In some embodiments, the first metal layer is a light-shielding metal layer 2, and the plurality of functional film layers further include a channel layer 4, a gate insulation layer 5 and a gate metal layer 6, formed above the buffer layer 3 in that order after the buffer layer 3 is formed and before the interlayer insulation layer 7 is formed.

Figure 2:
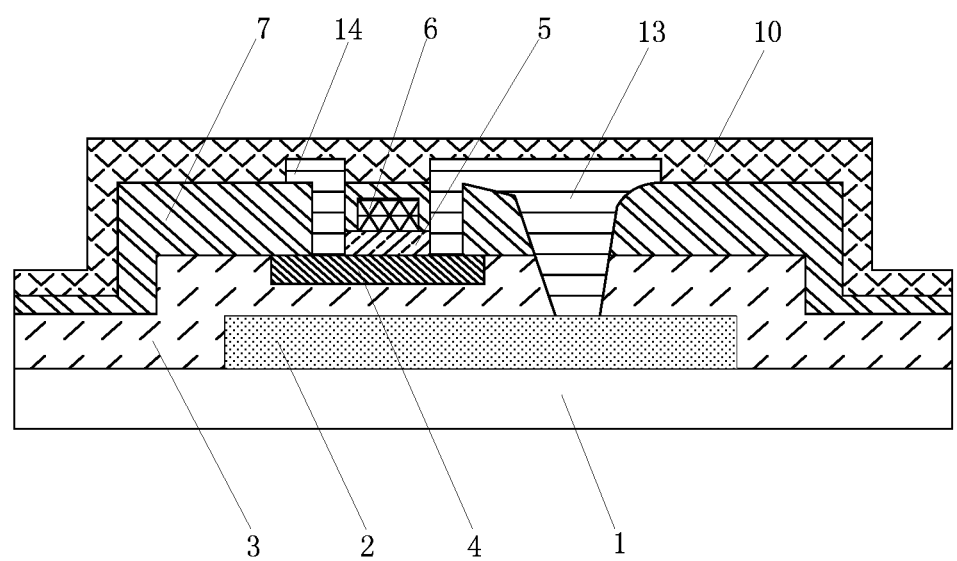
FIG. 2 is a schematic structural diagram of an array substrate according to the embodiments of the disclosure.
Figure 3:
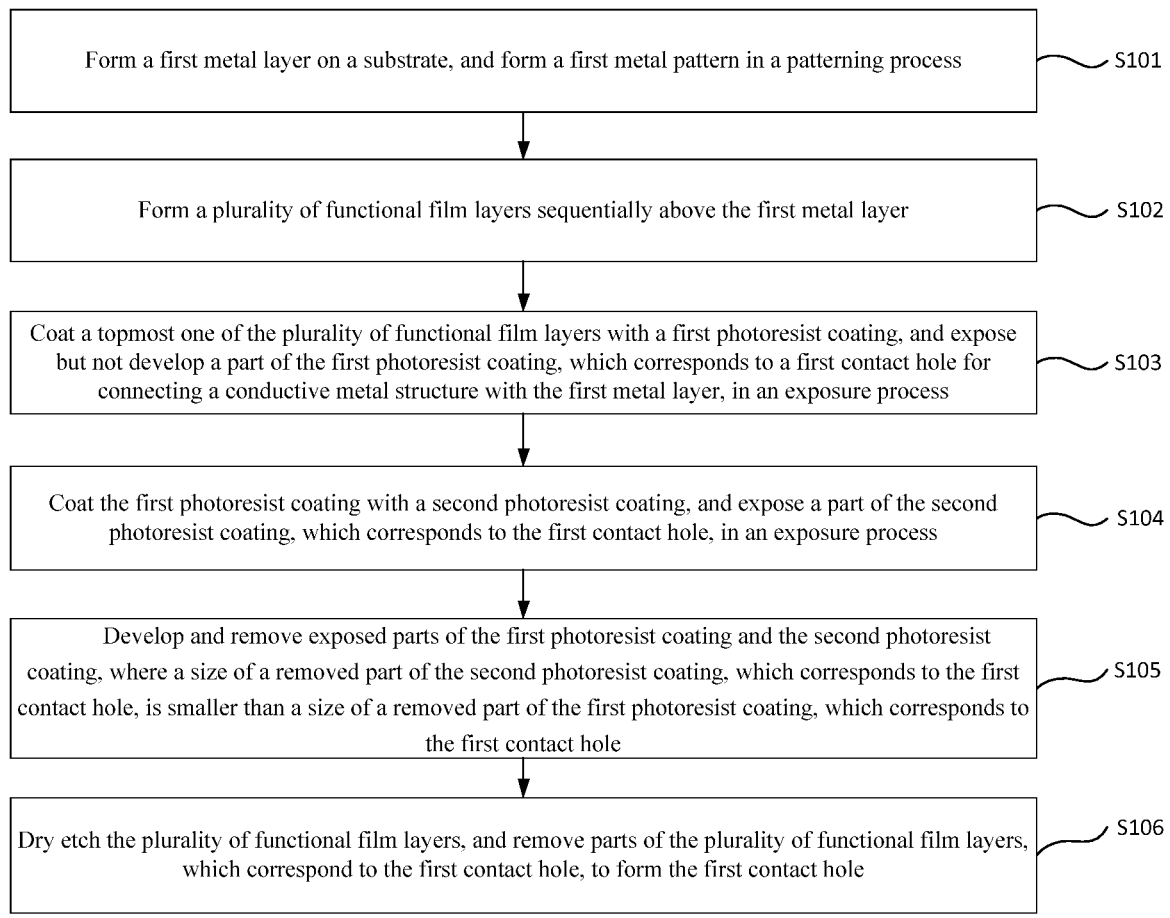
FIG. 3 is a schematic flow chart of a method for fabricating a contact hole of an array substrate according to the embodiments of the disclosure.

In some embodiments, the array substrate according to the embodiments of the disclosure includes a source 13 and a drain 14, where the source 13 or the drain 14 is formed with the conductive metal structure, and FIG. 2 illustrates the source formed with the conductive metal structure above. Where a part of the second photoresist coating 9, which corresponds to a second contact hole 12 for connecting the source 13 and the drain 14 in the array substrate with the channel layer 4 is further exposed in an exposure process, while the part thereof corresponding to the first contact hole 11 is being exposed.

In some embodiments, the plurality of functional film layers are dry-etched by dry-etching the interlayer insulation layer 7, and removing a part of the interlayer insulation layer 7, which corresponds to the first contact hole 11, so that a preliminary first contact hole 71 is formed; ashing the second photoresist coating 9 and the first photoresist coating 8 to remove the second photoresist coating 9, and to form a via hole 81 through a part of the first photoresist coating 8, which corresponds to the second contact hole 12, to expose the interlayer insulation layer 7; and dry-etching the interlayer insulation layer 7 and the buffer layer 3 to remove a part of the interlayer insulation layer 7, which corresponds to the second contact hole 12, to form the second contact hole 12, and further removing a part of the buffer layer 3, which corresponds to the first contact hole 11, to form the first contact hole 11 based on the preliminary first contact hole 71.

In the embodiments of the disclosure, the source or the drain includes the conductive metal structure so that when a pattern of the source and the drain is formed, a conductive metal is formed in the first contact hole 11 for connecting the source 13 or the drain 14 with the light-shielding metal layer 2, that is, the side of the source or the drain formed in the first contact hole 11 has a certain slope, so the conductive metal will not be easily broken, thus greatly alleviating the risk of breakage while the source or the drain is being deposited.

In some embodiments, the first photoresist coating 8 is post-baked after the first photoresist coating 8 is exposed in the exposure process, and before the second photoresist coating 9 is coated.

In the embodiments of the disclosure, after the first photoresist coating 8 is exposed, it is post-baked instead of being developed, that is, the part to be removed of the first photoresist coating 8 is not removed for the time being, so that the thickness of the part of the second photoresist coating 9, which corresponds to the first contact hole 11, will not increase, and the second photoresist coating 9 can be formed with a uniform thickness to thereby facilitate coating of the second photoresist coating 9 and a subsequent process; and exposure and then post-baking can alleviate in effect the effect of a standing wave to thereby alleviate a drawback arising from the standing wave so as to improve the quality of a masked pattern.

In some embodiments, after the gate insulation layer 5 is formed on a pattern of the channel layer 4, and the gate metal layer 6 is formed on the gate insulation layer 5, a pattern of the gate insulation layer 5 and a gate pattern are formed.

Where the pattern of the gate insulation layer 5 and the gate pattern are formed by: coating the gate metal layer 6 with a photoresist; exposing the photoresist using a mask to form a gate mask; wet-etching the gate metal layer 6 to form the gate pattern; reserving the photoresist, and dry-etching the gate insulation layer 5 to form the pattern of the gate insulation layer; and etch-stripping the photoresist to remove the photoresist.

In the embodiments of the disclosure, the gate insulation layer 5 is formed on the channel layer 4, and subsequently the gate metal layer 6 is formed on the gate insulation layer 5 and coated with photoresist, and after the gate pattern is formed in a patterning process, and before the pattern of the gate insulation layer is fabricated, the photoresist on the gate pattern is reserved, and the gate insulation layer 5 is dry-etched directly to form the pattern of the gate insulation layer 5. Therefore, a process of masking the gate insulation layer 5 is dispensed while the pattern of the gate insulation layer 5 is being formed, to thereby simplify the process of fabricating the film layer as a whole so as to improve the speed of fabricating the film layer, and to lower a cost thereof.

In the method above for fabricating the contact hole of the array substrate according to the embodiments of the disclosure, an edge of a second via hole 91 formed in the second photoresist coating 9 in correspondence to the first contact hole 11 protrudes more than an edge of the first via hole 82 formed in the first photoresist coating 8 in correspondence to the first contact hole 11 by 2 μm to 4 μm along a direction toward a center axis of the second via hole 91.

In some embodiments, the edge of the second via hole 91 formed in the second photoresist coating 9 in correspondence to the first contact hole 11 protrudes more than the edge of the first via hole 82 formed in the first photoresist coating 8 in correspondence to the first contact hole 11 by 3 μm, so that the side of the preliminary first contact hole 71 in the embodiments of the disclosure will have a preset slope to thereby facilitate formation of the first contact hole 11 with a good slope so as to alleviate the risk of breaking the source or the drain.

In some embodiments, a thickness of the light-shielding metal layer 2 ranges from 0.1 μm to 0.2 μm.

In some embodiments, the thickness of the light-shielding metal layer 2 is 0.15 μm.

In some embodiments, a thickness of the buffer layer 3 ranges from 0.3 μm to 0.5 μm; and/or a thickness of the channel layer 4 ranges from 0.05 μm to 0.09 μm; and/or a thickness of the gate insulation layer 5 ranges from 0.1 μm to 0.2 μm; and/or a thickness of the gate metal layer 6 ranges from 0.4 μm to 0.6 μm; and/or a thickness of the interlayer insulation layer 7 ranges from 0.3 μm to 0.5 μm.

In some embodiments, a thickness of the first photoresist coating 8 is less than or equal to a thickness of the second photoresist coating 9.

In some embodiments, the thickness of the first photoresist coating 8 is set the same as the thickness of the second photoresist coating 9. If the thickness of the first photoresist coating 8 is the same as the thickness of the second photoresist coating 9, then the first photoresist coating 8 and the second photoresist coating 9 may be ashed by removing the second photoresist coating 9, and also removing exactly the part of the first photoresist coating 8, which corresponds to the second contact hole 12, to form the via hole 81 so as to exactly expose the interlayer insulation layer 7, so that the part of the first photoresist coating 8, which corresponds to the second contact hole 12, can be avoided from being removed incompletely or excessively, which would otherwise damage the interlayer insulation layer 7, thus facilitating formation of a eligible second contact hole 12.

In some embodiments, a material of the interlayer insulation layer 7 is the same as a material of the buffer layer 3. The material of the interlayer insulation layer 7 is the same as the material of the buffer layer 3 to thereby facilitate fabrication of the film layers.

As illustrated in FIG. 2, the embodiments of the disclosure further provide an array substrate including a contact hole, wherein the contact hole is fabricated by using the method for fabricating the contact hole of the array substrate according to any one of the embodiments above of the disclosure.

In some embodiments, the contact hole includes the first contact hole 11 and the second contact hole 12; and the array substrate further includes a metal layer formed on an interlayer insulation layer 7 of the plurality of functional film layers after the first contact hole 11 and the second contact hole 12 are formed.

In some embodiments, the metal layer includes a pattern of the source and the drain, formed in a patterning process; and the array substrate further includes a passivation layer 10 formed on the pattern of the source and the drain.

In the array substrate above according to the embodiments of the disclosure, the contact hole in the array substrate is fabricated using the method for fabricating the contact hole of the array substrate according to any one of the embodiments above of the disclosure; and in the metal structure formed after the first contact hole 11 and the second contact hole 12 are formed, the side of the metal structure formed in the first contact hole 1 has a certain slope, so that the metal structure appears in the shape of a inverted frustum, and thus will not be broken easily, thus alleviating the risk of breaking the metal structure deposited in the first contact hole 11. In this way, the risk of breakage while the source or the drain is being deposited and formed in the first contact hole 11 can be greatly alleviated.

In some embodiments, a thickness of the metal layer ranges from 0.5 μm to 0.7 μm.

Furthermore the embodiments of the disclosure further provide a display device including the array substrate above according to the embodiments of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for fabricating a contact hole of an array substrate, the method comprising:
   forming a first metal layer on a substrate, and forming a first metal pattern in a patterning process;
   forming a plurality of functional film layers sequentially above the first metal pattern;
   coating a topmost one of the plurality of functional film layers with a first photoresist coating, and exposing but not developing a part of the first photoresist coating, which corresponds to a first contact hole for connecting a conductive metal structure with the first metal layer, in an exposure process;
   coating the first photoresist coating with a second photoresist coating, and exposing a part of the second photoresist coating, which corresponds to the first contact hole, in an exposure process;
   developing and removing exposed parts of the first photoresist coating and the second photoresist coating; wherein a size of a removed part of the second photoresist coating, which corresponds to the first contact hole, is smaller than a size of a removed part of the first photoresist coating, which corresponds to the first contact hole; and
   dry-etching the plurality of functional film layers, and removing parts of the plurality of functional film layers, which correspond to the first contact hole, to form the first contact hole;
   wherein an edge of a second via hole formed in the second photoresist coating in correspondence to the first contact hole protrudes more than an edge of the first via hole formed in the first photoresist coating in correspondence to the first contact hole by 2 μm to 4 μm along a direction toward a center axis of the second via hole.

2. The method for fabricating the contact hole of the array substrate according to claim 1, wherein the plurality of functional film layers comprise a buffer layer and an interlayer insulation layer, formed above the first metal layer in that order, and the first contact hole extends through the interlayer insulation layer and the buffer layer.

3. The method for fabricating the contact hole of the array substrate according to claim 2, wherein the first metal layer is a light-shielding metal layer, and the plurality of functional film layers further comprise a channel layer, a gate insulation layer and a gate metal layer, formed above the buffer layer in that order after the buffer layer is formed, and before the interlayer insulation layer is formed.

4. The method for fabricating the contact hole of the array substrate according to claim 3, wherein the array substrate comprises a source and a drain, the source or the drain is formed with the conductive metal structure; and a part of the second photoresist coating, which corresponds to a second contact hole for connecting the source and the drain in the array substrate with the channel layer, is further exposed in an exposure process while the part thereof corresponding to the first contact hole is being exposed; and dry-etching the plurality of functional film layers comprises:

dry-etching the interlayer insulation layer, and removing a part of the interlayer insulation layer, which corresponds to the first contact hole;

ashing the second photoresist coating and the first photoresist coating to remove the second photoresist coating, and to form a via hole through a part of the first photoresist coating, which corresponds to the second contact hole, to expose the interlayer insulation layer; and dry-etching the interlayer insulation layer and the buffer layer to remove a part of the interlayer insulation layer, which corresponds to the second contact hole, to form the second contact hole, and removing a part of the buffer layer, which corresponds to the first contact hole, to form the first contact hole.

5. The method for fabricating the contact hole of the array substrate according to claim 3, wherein the method further comprises:

forming a pattern of the gate insulation layer and a gate pattern, after the gate insulation layer is formed on a pattern of the channel layer and the gate metal layer is formed on the gate insulation layer;

wherein forming the pattern of the gate insulation layer and the gate pattern comprises:

coating the gate metal layer with a photoresist;

exposing the photoresist using a mask to form a gate mask;

wet-etching the gate metal layer to form the gate pattern;

reserving the photoresist, and dry-etching the gate insulation layer to form the pattern of the gate insulation layer; and etch-stripping the photoresist to remove the photoresist.

6. The method for fabricating the contact hole of the array substrate according to claim 3, wherein a thickness of the buffer layer ranges from 0.3 µm to 0.5 µm; and/or a thickness of the channel layer ranges from 0.05 µm to 0.09 µm; and/or a thickness of the gate insulation layer ranges from 0.1 µm to 0.2 µm; and/or a thickness of the gate metal layer ranges from 0.4 µm to 0.6 µm; and/or a thickness of the interlayer insulation layer ranges from 0.3 µm to 0.5 µm.

7. The method for fabricating the contact hole of the array substrate according to claim 2, wherein a material of the interlayer insulation layer is same as a material of the buffer layer.

8. The method for fabricating the contact hole of the array substrate according to claim 3, wherein a thickness of the light-shielding metal layer ranges from 0.1 µm to 0.2 µm.

9. The method for fabricating the contact hole of the array substrate according to claim 8, wherein the thickness of the light-shielding metal layer is 0.15 µm.

10. The method for fabricating the contact hole of the array substrate according to claim 1, wherein the method further comprises:

post-baking the first photoresist coating after the first photoresist coating is exposed in an exposure process, and before the second photoresist coating is coated.

11. The method for fabricating the contact hole of the array substrate according to claim 1, wherein a thickness of the first photoresist coating is less than or equal to a thickness of the second photoresist coating.

12. An array substrate, comprising a contact hole, wherein the contact hole is fabricated using the method for fabricating the contact hole of the array substrate according to claim 1.

13. The array substrate according to claim 12, wherein the contact hole comprises a first contact hole and a second contact hole; and the array substrate further comprises a second metal layer formed on an interlayer insulation layer of the plurality of functional film layers after the first contact hole and the second contact hole are formed.

14. The array substrate according to claim 13, wherein the metal layer comprises a pattern of a source and a drain, formed in a patterning process; and the array substrate further comprises a passivation layer formed on the pattern of the source and the drain.

15. The array substrate according to claim 13, wherein a thickness of the metal layer ranges from 0.5 µm to 0.7 µm.

16. A display device, comprising the array substrate according to claim 12.

* * * * *